US009070806B2

(12) United States Patent
Lee

(10) Patent No.: US 9,070,806 B2
(45) Date of Patent: Jun. 30, 2015

(54) SELF-POWERED SOLAR TRACKER

(76) Inventor: Jae Jin Lee, Chungcheongbuk-do (KR)

( * ) Notice: Subject to any disclaimer, the term of this patent is extended or adjusted under 35 U.S.C. 154(b) by 0 days.

(21) Appl. No.: 14/114,884

(22) PCT Filed: Aug. 22, 2012

(86) PCT No.: PCT/KR2012/006653
§ 371 (c)(1),
(2), (4) Date: Oct. 30, 2013

(87) PCT Pub. No.: WO2013/122298
PCT Pub. Date: Aug. 22, 2013

(65) Prior Publication Data
US 2014/0202521 A1 Jul. 24, 2014

(30) Foreign Application Priority Data

Feb. 13, 2012 (KR) .......................... 10-2012-0014319

(51) Int. Cl.
*H02N 6/00* (2006.01)
*H01L 31/042* (2014.01)
(Continued)

(52) U.S. Cl.
CPC .............. *H01L 31/0422* (2013.01); *F24J 2/38* (2013.01); *F24J 2/40* (2013.01); *G01S 3/7861* (2013.01); *H02S 20/00* (2013.01)

(58) Field of Classification Search
CPC ...................................................... H02S 20/32
See application file for complete search history.

(56) References Cited

U.S. PATENT DOCUMENTS

| 4,223,174 | A * | 9/1980 | Moeller | 136/246 |
| 2011/0041834 | A1 | 2/2011 | Liao | 126/605 |
| 2012/0103393 | A1 * | 5/2012 | Wu et al. | 136/246 |

FOREIGN PATENT DOCUMENTS

| CN | 201476782 U * | 5/2010 |
| JP | 8-95641 A | 4/1996 |

(Continued)

OTHER PUBLICATIONS

International Search Report mailed Feb. 14, 2013, issued in corresponding International Patent Application No. PCT/KR2012/006653.

(Continued)

*Primary Examiner* — Eli Mekhlin
(74) *Attorney, Agent, or Firm* — Stein IP, LLC

(57) ABSTRACT

Provided is a self-powered solar tracker, which is a solar tracker for adjusting the altitude of and horizontally rotating a solar collector panel such that the solar collector panel on which a plurality of solar cells are provided can face the sun, wherein the self-powered solar tracker comprises: an altitude adjustment optical sensor unit which has one or more first optical sensors formed by being uniformly spaced on the upper side of convex support surfaces to face the sun and one or more second optical sensors formed by being uniformly spaced on the lower side of the convex support surfaces, and which senses the sunlight so as to adjust the altitude of the solar collector panel; a horizontal rotation optical sensor unit which has one or more third optical sensors formed by being uniformly spaced on the left side of the convex support surfaces to face the sun and one or more fourth optical sensors formed by being uniformly spaced on the right side of the convex support surfaces, and which senses sunlight so as to horizontally rotate the solar collector panel; a passive element circuit which has one or more first comparison circuits for comparing the difference in the quantity of output light between the first optical sensors and the second optical sensors and one or more second comparison circuits for comparing the difference in the quantity of output light between the third optical sensors and the fourth optical sensors, and which outputs a driving value for adjusting the altitude of and horizontally rotating the solar collector panel in the direction having a larger light value; an altitude adjustment driving unit for receiving a driving power source from the solar cells of the solar collector panel and for adjusting the altitude of the solar collector panel according to the driving value of the passive element circuit; and a horizontal rotation driving unit for performing the horizontal rotation.

12 Claims, 12 Drawing Sheets

(51) Int. Cl.
*F24J 2/38* (2014.01)
*F24J 2/40* (2006.01)
*G01S 3/786* (2006.01)

(56) References Cited

FOREIGN PATENT DOCUMENTS

| JP | 2000-155026 | A | | 6/2000 |
| JP | 2006-114634 | A | | 4/2006 |
| JP | 2007-180484 | A | | 7/2007 |
| KR | 10-0420839 | B1 | | 3/2004 |
| KR | 10-2009-0098591 | A | | 9/2009 |
| KR | 10-2008-0070627 | | * | 1/2010 |
| KR | 10-2010-0009820 | A | | 1/2010 |

OTHER PUBLICATIONS

Japanese Office Action issued on Sep. 1, 2014 by the Japanese Patent Office.

* cited by examiner

SELF-POWERED SOLAR TRACKER

CROSS-REFERENCE TO RELATED APPLICATIONS

This application is a national stage of International Application No. PCT/KR2012/006653, filed Aug. 22, 2012, which claims the benefit of Korean Application No. 10-2012-0014319, filed Feb. 13, 2012, in the Korean Intellectual Property Office. All disclosures of the document(s) named above are incorporated herein by reference.

BACKGROUND OF THE INVENTION

1. Field of the Invention

The present invention relates to a solar tracker that automatically adjusts an angle of a solar collector to enable the solar collector to effectively receive the sunlight while varying a position according to the angle of incidence of sunlight in a solar generator that converts solar energy into electrical energy, and more particularly, to a self-powered solar tracker capable of adjusting an angle of a solar collector using optical sensors, such that the solar collector can optimally receive sunlight, and also capable of tracking the sun using self-generating power.

2. Description of the Related Art

In general, a solar generator, consisting of solar cells, a storage battery, and an electricity conversion device, is a generator that collects sunlight using a solar collector panel having multiple solar cells installed thereon, and converts the solar energy into electrical energy. The solar generators varying in output capacity depending on the number of installed solar cells can generate as much amount of power as desired, at a desired place, allowing both large-scale and small-scale power generations, and thus the solar generators are increasingly used for a wide range of purposes, for home use up to large-scale industrial use.

The solar generators may be categorized into fixed type solar generators and sun-tracking type solar generators, according to the installation method of a solar collector panel.

The fixed-type solar generator has a structure in which a solar collector panel is fixedly disposed at a predefined angle at which the solar collector panel can receive the most amount of sunlight. This structure is simple and easy to install, and has a high durability and simple maintenance, whereas the amount of power generated varies drastically with the angle of incidence of sunlight, resulting in a low average efficiency of generation.

Meanwhile, the sun-tracking solar generators are classified into a single-axis tracker and a two-axis tracker: the single-axis tracker rotating a solar collector panel to track the sun from sunrise to sunset as the sun moves from the east to the west; and the two-axis tracker rotating a solar cell module to track the changes in a meridian altitude of the sun, wherein the single-axis tracker has a comparatively simple structure with less efficiency compared to the two-axis tracker, whereas the two-axis tracker has the solar cell module to be positioned always in a perpendicular direction to the incident direction of the sunlight, thereby being able to maximize the efficiency of generator.

To develop the aforementioned sun-tracking solar generators, technologies to collect solar heat or concentrate the sunlight by tracking the sun are required. Because the sun continuously changes in apparent position due to the rotation and revolution of the Earth, a solar tracker is required to effectively collect and concentrate more solar energy per a unit time.

A solar tracker may be categorized into two types of solar tracker: a coordinate calculating type in which a driving motor operates to track the sun according to coordinates calculated by a program; and an optical sensor type in which a driving motor is controlled to track the sun according to an output signal occasionally detected by optical sensors.

The coordinate calculating type has an advantage in tracking the sun, regardless of the weather conditions, but accumulated errors should be periodically corrected, and the difference in latitudes and longitudes that vary with regions hamper the maintenance and repair of the solar tracker. On the contrary, the optical sensor type has a comparatively simple structure, but cannot track the sun under the cloudy sky weather, and if such cloudy weather condition lasts for a long enough time for the sun to change in position, the solar tracker may not be able to track the sun since the sun may move beyond the range available for the solar tracker, so that operation consistency may not be achieved.

Further, the aforementioned conventional solar trackers of the coordinate calculation type and optical sensor type include a complex control board to run a program or to process optical sensing values. Accordingly, an additional power supply is required to run the control board and failures frequently occur due to a central processing unit (CPU) used in the control board.

SUMMARY OF THE INVENTION

Technical Problem

It is one of objectives of the present invention to provide a self-powered solar tracker capable of adjusting an angle of a solar collector to be optimized to receive the sunlight by use of optical sensors without the help of an additional CPU, and also tracking the sunlight using a self-generating power.

Technical Solution

The present invention provides a self-powered solar tracker for adjusting an altitude of and horizontally rotating a solar collector panel such that the solar collector panel on which a plurality of solar cells are provided can face the sun, the solar tracker including: an altitude adjustment optical sensor unit configured to include one or more first optical sensors formed by being uniformly spaced on an upper side of a convex support surface to face the sun and one or more second optical sensors formed by being uniformly spaced on a lower side of the convex support surface, and to sense sunlight so as to adjust an altitude of the solar collector panel; a horizontal rotation optical sensor unit configured to include one or more third optical sensors formed by being uniformly spaced on a left side of the convex support surface to face the sun and one or more fourth optical sensors formed by being uniformly spaced on a right side of the convex support surface, and to sense sunlight so as to horizontally rotate the solar collector panel; a passive element circuit configured to include one or more first comparison circuits for comparing a difference in output light intensity between the first optical sensors and the second optical sensors and one or more second comparison circuits for comparing a difference in output light intensity between the third optical sensors and the fourth optical sensors, and to output a driving value for adjusting the altitude of and horizontally rotating the solar collector panel in a direction having a larger light intensity value; an altitude adjustment driving unit configured to receive a driving power source from the solar cells of the solar collector panel and to adjust the altitude of the solar collector panel in response to the driving value of the passive element circuit; and a horizontal rotation driving unit configured to perform the horizontal rotation.

The one or more first comparison circuits may compare the output light intensities of the first optical sensors with the output light intensities of the second optical sensors, and output a driving value to adjust the altitude of the solar collector panel in a direction having a larger light intensity value, and the one or more second comparison circuits may compare the output light intensities of the third optical sensors with the output light intensities of the fourth optical sensors, and output a driving value to horizontally rotate the solar collector panel in a direction having a larger light intensity value.

The one or more first comparison circuits may compare the output light intensities between the first optical sensors and the second optical sensors, and output a driving value for altitude adjustment to move the solar collector panel upward if light intensity values of the first optical sensors are greater than those of the second optical sensors, or to move the solar collector panel downward if the light intensities values of the second optical sensors are greater, and the one or more second comparison circuits may compare the output light intensities between the third optical sensors and the fourth optical sensors, and output a driving value to horizontally rotate the solar collector panel in a left direction if any of light intensity values of the third optical sensors are greater than those of the fourth optical sensors, or to horizontally rotate the solar collector panel in a right direction if any of light intensity values of the fourth optical sensors are greater than the third optical sensors.

The horizontal rotation optical sensor unit may further include one or more fifth optical sensors being disposed on a rear side of the convex support surface with the sun behind.

The one or more second comparison circuits may compare the output light intensities between the fifth optical sensors and the fourth optical sensors, and output a driving value to horizontally rotate the solar collector panel in a left direction if any of intensity light values of the fifth optical sensors are greater than those of the fourth optical sensors.

Each of the altitude adjustment optical sensor unit and the horizontal rotation optical sensor unit may further include one or more partitions extending radially from the convex support surface, so as to prevent each optical sensor from being irradiated with light intended to be incident to a neighboring optical sensor.

The one of the partitions may be mounted on a portion of the convex supporting surface that directly faces the sun.

The partitions may be made of a light-absorbing material or a material with a low optical reflectivity.

Each of the optical sensors, which are included in the altitude adjustment optical sensor unit and the horizontal rotation optical sensor unit, may have at least a part of a lower end to be inserted in the support surface.

Each of the altitude adjustment optical sensor unit and the horizontal rotation optical sensor unit may further include a case configured to prevent light entering from both sides of each optical sensor.

The altitude adjustment driving unit and the horizontal rotation driving unit may be driven when the solar collector panel is irradiated with more than a predetermined intensity of sunlight.

The altitude adjustment driving unit may perform altitude adjustment of the solar collector panel in a direction having a larger light intensity value by contracting and extending according to an output from the first comparison circuits.

The horizontal rotation driving unit may perform horizontal rotation of the solar collector panel in a direction having a larger light intensity value by contracting and extending according to an output from the second comparison circuits.

The altitude adjustment optical sensor unit and the horizontal rotation optical sensor unit may be integrally formed on the solar collector panel.

The one or more first sensors and the one or more second sensors of the altitude adjustment optical sensor unit may be disposed on the solar collector panel to be in a perpendicular to a solar collecting surface, and the one or more third sensors and the one or more fourth sensors of the horizontal rotation optical sensor unit may be disposed on the solar collector panel to be in a horizontal to a ground surface.

Advantageous Effects

According to the present invention, it is possible to drive a solar tracker using self-generating power rather than an external power source, by driving an altitude adjustment driving unit and a horizontal rotation driving unit with a power generated from solar cells of a solar collector panel, and to mechanically prevent the damage due to malfunction in left, right, up and down operations. In addition, since it is possible to implement the solar tracker with an analog-DC circuit, not a digital control circuit, the durability can be ensured for a length of time, depending on the lifetime of a passive element circuit, and since additional programs or CPU are not required to process coordinate calculation or optical sensing values, the maintenance is easy, and the durability is significantly increased.

In addition, according to the present invention, the altitude adjustment optical sensor unit and the horizontal rotation optical sensor unit compare light intensity of sunlight incident to them, determine a direction having a larger light intensity value for altitude adjustment or horizontal rotation of the solar collector panel, and perform the altitude adjustment or the horizontal rotation until the light intensity values reach the same value. Since the sensor units are driven with a minute DC current, they can be driven with a current generated by a small amount of radiant light or reflective light. Moreover, the solar tracker does not need to operate if no solar generation occurs. The altitude adjustment driving unit and the horizontal rotation driving unit can be driven only when the solar collector panel is irradiated with more than a predetermined amount of sunlight. At nighttime, when light is insufficient and there is hence no solar power output, the altitude adjustment driving unit and the horizontal rotation driving unit are not driven even when the altitude adjustment optical sensor unit and the horizontal rotation optical sensor unit detect incident light, and thereby it is possible to prevent the occurrence of malfunctions in the solar tracker.

Additional aspects and/or advantages of the invention will be set forth in part in the description which follows and, in part, will be obvious from the description, or may be learned by practice of the invention.

BRIEF DESCRIPTION OF THE DRAWINGS

These and/or other aspects and advantages of the invention will become apparent and more readily appreciated from the following description of the embodiments, taken in conjunction with the accompanying drawings.

DETAILED DESCRIPTION OF THE EMBODIMENTS

Figure 1:
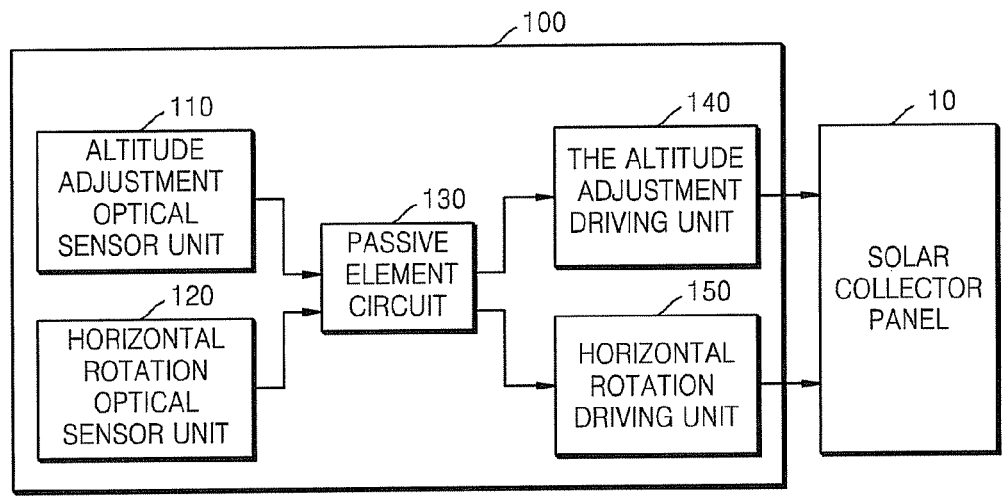
FIG. 1 is a configuration block diagram of a self-powered solar tracker according to an exemplary embodiment of the present invention.

The invention is described more fully hereinafter with reference to the accompanying drawings, in which exemplary embodiments of the invention are shown. This invention may, however, be embodied in many different forms and should not be construed as limited to the embodiments set forth herein. Rather, these embodiments are provided so that this disclosure is thorough, and will fully convey the scope of the invention to those skilled in the art. In the drawings, the size and relative sizes of layers and regions may be exaggerated for clarity. Like reference numerals in the drawings denote like elements. It will be understood that the terms used herein are defined in consideration of the functions of elements in the present invention, and are not intended to be limiting of the invention.

FIG. 1 is a configuration block diagram illustrating a self-powered solar tracker according to an exemplary embodiment of the present invention.

Referring to FIG. 1, in order for a self-powered solar tracker 100 to adjust an altitude of a solar collector panel 10 having a plurality of solar cells installed thereon and horizontally rotate the solar collector panel 10 such that the solar collector panel 10 can face the sun, the self-powered solar tracker 100 according to an exemplary embodiment may include an altitude adjustment optical sensor unit 110 to detect the sunlight for adjustment of the altitude of the solar collector panel 10, a horizontal rotation optical sensor unit 120 for horizontal rotation of the solar collector panel 10, and a passive element circuit 130, an altitude adjustment driving unit 250 and a horizontal rotation driving unit which are to output a driving value and perform the altitude adjustment and horizontal rotation of the solar collector panel in a direction in which greater intensity of radiation is shown.

The altitude adjustment optical sensor unit 110 may include one or more first optical sensors disposed at regular intervals on an upper part of a convex support surface to directly face the sun, and one or more second optical sensors disposed at regular intervals on a lower part of the convex support surface.

The horizontal rotation optical sensor unit 120 may include one or more third optical sensors disposed at regular intervals on the left part of the supporting surface and one or more fourth optical sensors disposed at regular intervals on the right part of the supporting surface.

The altitude adjustment optical sensor unit 110 and the horizontal rotation optical sensor unit 120 may be integrated into the solar collector plane 10.

In addition, the first and second sensors of the altitude adjustment optical sensor unit 110 may be disposed on the solar collector panel 10 to be perpendicular to a solar collecting surface of the solar collector panel 10, and the third and fourth sensors of the horizontal rotation optical sensor unit 120 may be disposed on the solar collector panel 10 to be in parallel to the ground surface.

The passive element circuit 130 may be configured to include one or more first comparison circuits that compare output light intensities between the first optical sensors and the second optical sensors, and one or more second comparison circuits that compare output light intensities between the third optical sensors and the fourth optical sensors, and output a driving value for performing the horizontal rotation and altitude adjustment of the solar collector plane in a direction in which greater intensity of radiation is detected. The passive element circuit 130 may be driven when the solar collector panel is irradiated with more than a certain amount of sunlight. The driving value from the passive element circuit 130 determines rotation amounts and directions of the driving motors (not shown) of the altitude adjustment driving unit 140 and the horizontal rotation driving unit 150.

The first comparison circuits may be configured to compare the output light intensities between the first optical sensors and the second optical sensors and output a driving value for adjusting the altitude of the solar collector panel in a direction in which a greater light intensity value is detected.

For example, the first comparison circuits may compare the output light intensities between the first optical sensors and the second optical sensors and output a driving value to adjust the height of the solar collector panel upward if the first optical sensors greater light intensity values than the second optical sensors, and adjust the height downward if the second optical sensors have greater light intensity values.

The second comparison circuits may be configured to compare the output light intensities between the third optical sensors and the fourth optical sensors and output a driving value for horizontal rotation of the solar collector panel in a direction in which a greater light intensity value is detected.

For example, the second comparison circuits may compare the output light intensities between the third optical sensors and the fourth optical sensors and output a driving value to horizontally rotate the solar collector panel to the left if the third optical sensors have greater light intensity values than the fourth optical sensors, and horizontally rotate the solar collector panel to the right if the fourth optical sensors have greater light intensity values.

The horizontal rotation optical sensor unit 120 may further include one or more fifth optical sensors disposed on a rear surface of the convex support surface of the optical sensor unit with the sun behind, and in this case, the second comparison circuit may compare the output light intensities between the fifth optical sensors and the fourth optical sensors, and output a driving value to horizontally rotate the solar collector panel to the left if the fifth sensors have greater light intensity values.

Each of the altitude adjustment optical sensor unit 110 and the horizontal rotation optical sensor unit 120 may have partitions which are mounted between the optical sensors, extending radially from the convex support surface, so as to prevent each optical sensor from being irradiated with light intended to be incident to a neighboring optical sensor. In this case, one partition may be mounted a portion of the convex support surface that directly faces the sun.

The altitude adjustment driving unit 140 is supplied with driving power from the solar cells of the solar collector panel 10, and adjusts the height of the solar collector panel according to a driving value from the passive element circuit 130.

The altitude adjustment driving unit 140 may be configured to extend and contract according to an output from the first comparison circuit, thereby adjusting the altitude of the solar collector panel in a direction in which a greater light intensity value is detected.

The horizontal rotation driving unit 150 is supplied with driving power from the solar cells of the solar collector panel 10 and horizontally rotates the solar collector panel according to a driving value from the passive element circuit 130.

The horizontal rotation driving unit 150 may be configured to extend and contract according to an output from the second comparison circuit, thereby horizontally rotating the solar collector panel in a direction in which a greater light intensity value is detected.

Because the altitude adjustment driving unit 140 and the solar collector panel 10 are supplied with driving power from the solar cells of the solar collector panel 10, they can be driven only when being irradiated with more than a certain amount of sunlight. At nighttime, when light is insufficient and there is hence no solar power output, the altitude adjustment driving unit 140 and the horizontal rotation driving unit 150 are not driven even when the altitude adjustment optical sensor unit 110 and the horizontal rotation optical sensor unit 120 detect incident light. On the other hand, the altitude adjustment driving unit 140 and the horizontal rotation driving unit 150 can be driven even in cloudy sky weather condition or at dusk or dawn, as long as the solar collector panel 10 is irradiated with more than a certain amount of sunlight.

Figure 2:
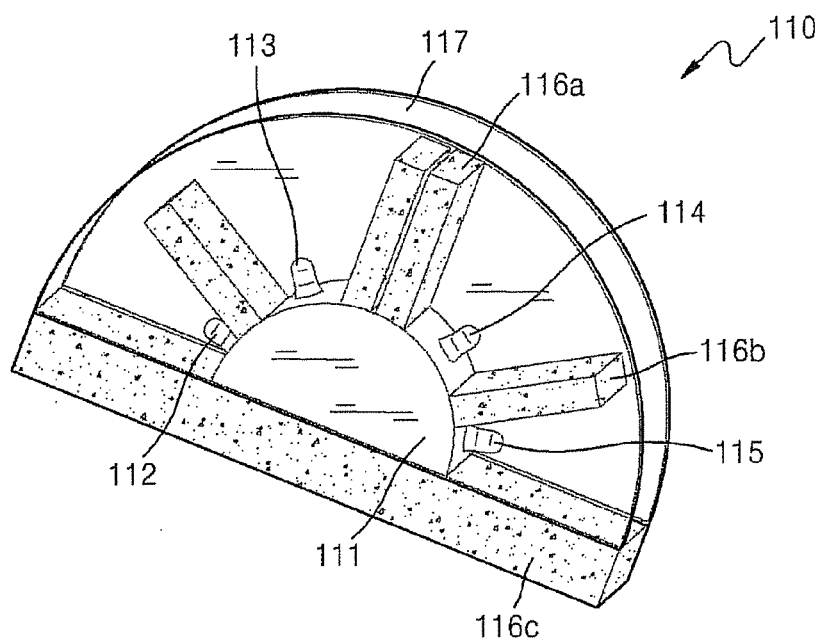
FIG. 2 is a diagram of an altitude adjustment optical sensor unit of the self-powered solar tracker according to an exemplary embodiment of the present invention.
Figure 3:
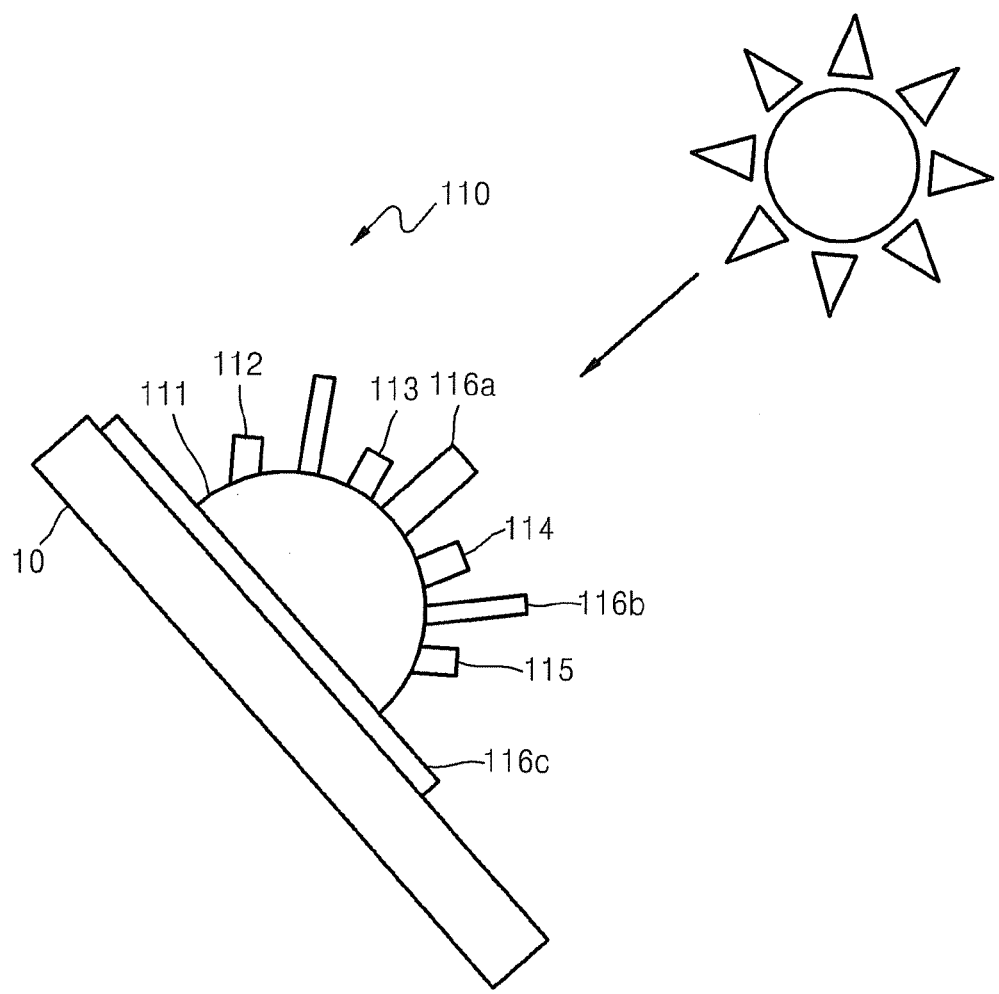
FIG. 3 is a diagram of the altitude adjustment optical sensor unit of the self-powered solar tracker according to an exemplary embodiment of the present invention.

FIG. 2 and FIG. 3 illustrate diagrams of an altitude adjustment optical sensor unit 110 of a self-powered solar tracker according to an exemplary embodiment of the present invention.

Referring to FIGS. 2 and 3, the altitude adjustment optical sensor unit 110 includes a first upper optical sensor 112, a second upper optical sensor 113, a first lower optical sensor 114, and a second lower optical sensor 115, which are disposed on a supporting unit 111 of a hemisphere shape. The first upper optical sensor 112 and the second optical sensor 114 are disposed on an upper part of the optical adjustment optical sensor unit 110, directly facing the sun, and the first lower optical sensor 114 and the second lower optical sensor 115 are disposed on a lower part of the altitude adjustment optical sensor unit 110.

Each optical sensor 112, 113, 114, and 115 may be electric elements, such as, photo transistors, photo diodes, CDS, and solar cells, which detect sunlight and generate electric currents. There are provided partitions 116a, 116b, and 116c between neighboring optical sensors 112, 113, 114, and 115. The partitions 116a, 116b, and 116c are mounted between the optical sensors 116a, 116b, and 116c, extending radially from the hemispheric supporting unit 111, so as to prevent each optical sensor from being irradiated with light intended to be incident to a neighboring optical sensor. One partition 116a is mounted on a surface that directly faces the sun. The partitions 116a, 116b, and 116c may be made of light-absorbing material. The partitions 116a, 116b, and 116c are fixed by a case 117. The case 117 may serve the same function as the partitions 116a, 116b, and 116c. Therefore, like the partitions 116a, 116b, and 116c, the case 117 may also be made of light-absorbing material that does not reflect or scatter light.

The mounting structure in which the case 117 and the partitions 116a, 116b, and 116c are mounted may be changed, if necessary. For example, FIG. 2 illustrates that a radius of the case 117 almost corresponds to the height of the partitions 116a, 116b, and 116c. However, the aspects of the present invention are not limited thereto, such that the radius of the case 117 may be longer or shorter than the height of the partitions 116a, 116b, and 116c. In addition, in the example of FIG. 2, the case 117 is made of a transparent material, but the aspects of the present invention are not limited thereto, such that the material used for the case 117 may be non-light reflective or non-light-transmissive. By the use of non-reflective or non-transmissive material for the case 117 and the appropriate adjustment of the radius of the case 117, the light incident from the side may be blocked with respect to the optical sensors 112, 113, 114, and 115 of the altitude adjustment optical sensor unit 110, and the optical sensors 112, 113, 114, and 115 of the altitude adjustment sensor unit 110 are each allowed to be irradiated only with light incident from the front thereof. By doing so, the light scattered, or reflected in various directions (e.g., in a side direction) with respect to the optical sensors 112, 113, 114, and 115 of the altitude adjustment sensor unit 110 can be prevented and only the sunlight entering from the front of the sensors is allowed to be radiated to the optical sensors 112, 113, 114, and 115 of the altitude adjustment optical sensor unit 110, thereby controlling the optical sensing direction more precisely.

Each of the optical sensors 112, 113, 114, and 115 of the altitude adjustment optical sensor unit 110 may be formed to have at least a part of a lower part to be inserted into the supporting unit 111, so as to perform more precise optical sensing. More specifically, the supporting unit 111 has concave portions in which the respective optical sensors 112, 113, 114, and 115 are positioned, so that the lower part of each optical sensor 112, 113, 114, and 115 can be inserted into the supporting unit 111.

At least a part of each lower part of the respective optical sensors 112, 113, 114, and 115 of the altitude adjustment optical sensor unit 110 may be surrounded by, for example, shrinkable rubber, thereby being able to block light rays incident to the sides of the respective optical sensors 112, 113, 114, and 115 more effectively.

The altitude adjustment optical sensor unit 110 may be disposed on the solar collector panel 10 in a direction perpendicular to a solar collecting surface of the solar collector panel 10. The altitude adjustment optical sensor unit 110 may be disposed at various positions on the solar collector panel 10.

For example, the altitude adjustment optical sensor unit 110 may be located at the right upper part of the solar collector panel 10. However, aspects of the present invention are not limited thereto, such that the altitude adjustment optical sensor unit 110 can be located at various positions on the solar collector panel 10, such as the right side, the right lower part, the left upper part, the left lower part, a central upper part, and a central lower part.

The passive element circuit 130 compares the output light intensities of the upper light sensor 112, the second upper optical sensor 113, the first lower optical sensor 114 and the second lower optical sensor 115, and outputs a driving signal to adjust the altitude of the solar collector panel in a direction having a larger output light intensity value. The passive element circuit 130 outputs the driving signal with respect to the altitude adjustment driving unit 360 to control the solar collector panel 10 to move upwards or downwards.

The passive element circuit 130 compares the output light intensities of the upper optical sensors 112 and 113 with the output light intensities of the lower optical sensors 114 and 115. That is, the passive element circuit 130 may compare the output light intensities between the first upper optical sensor 112 and the first lower optical sensor 114, between the first upper optical sensor 112 and the second lower optical sensor 115, between the second upper optical sensor 113 and the first lower optical sensor 114, and between the second upper optical sensor 113 and the second lower optical sensor 115.

The passive element circuit 130 compares the output light intensities of the upper optical sensors 112 and 113 with the output light intensities of the lower optical sensors 114 and 115, and outputs the driving signal to adjust the altitude of the solar collector panel 10 in a direction having a larger output light intensity value.

For example, the passive element circuit 130 compares the first upper optical sensor 112 and the first lower optical sensor 114, and if the output light intensity of the first upper optical sensor 112 is greater than that of the first lower optical sensor 114, outputs a driving signal for the altitude adjustment driving unit 360 to control the solar collector panel 10 to move upwards.

On the other hands, the passive element circuit 130 compares the first upper optical sensor 112 and the first lower optical sensor 114, and if the output light intensity of the first lower optical sensor 114 is greater than that of the first upper optical sensor 112, outputs a driving signal for the altitude adjustment driving unit 360 to control the solar collector panel 10 to move downwards.

In addition, if there is no significant difference in output light intensity between the first upper optical sensor 112 and the first lower optical sensor 114 when comparing the first upper optical sensor 112 and the first lower optical sensor 114, the passive element circuit 130 outputs a driving signal for the altitude adjustment driving unit 360 to maintain the solar collector panel 10 at its current position.

Figure 4:
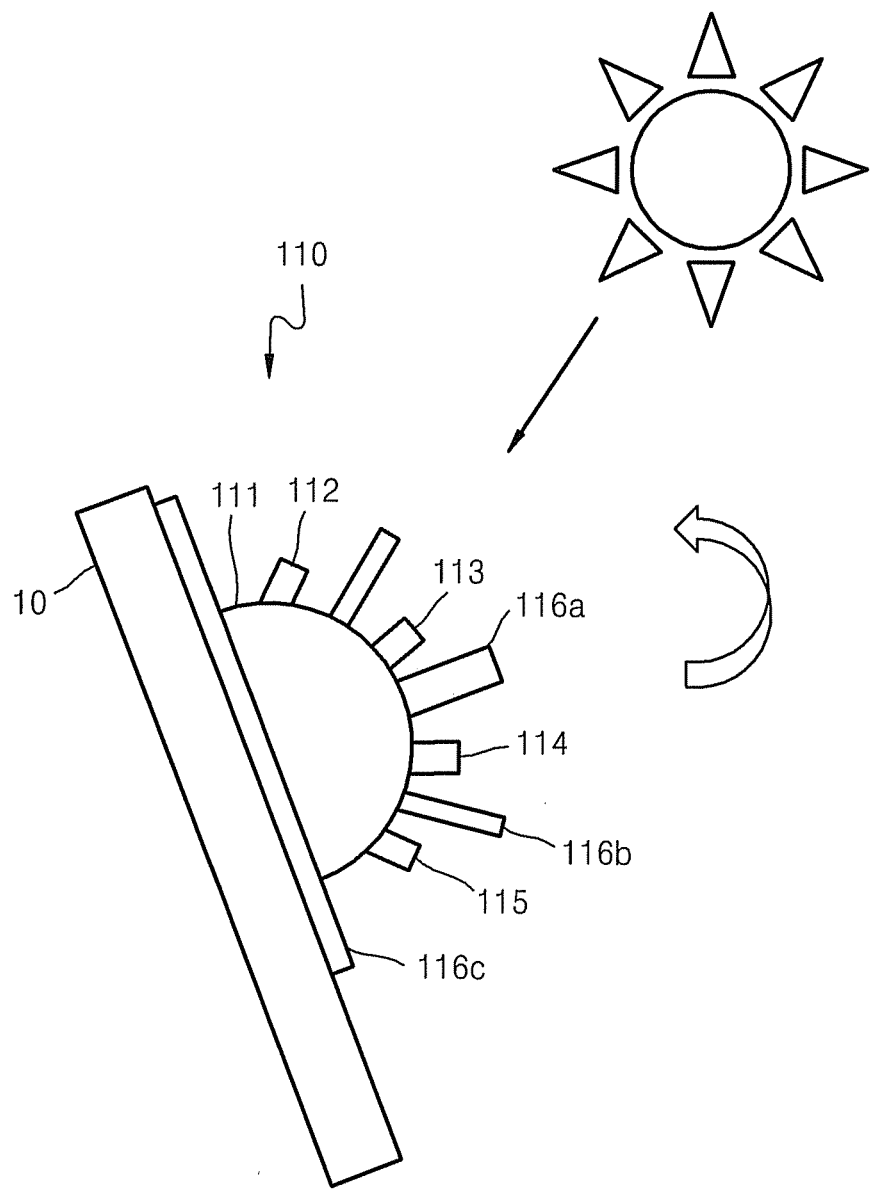
FIG. 4 is a diagram for explaining an operation of the altitude adjustment optical sensor unit of the self-powered solar tracker according to an exemplary embodiment of the present invention.
Figure 5:
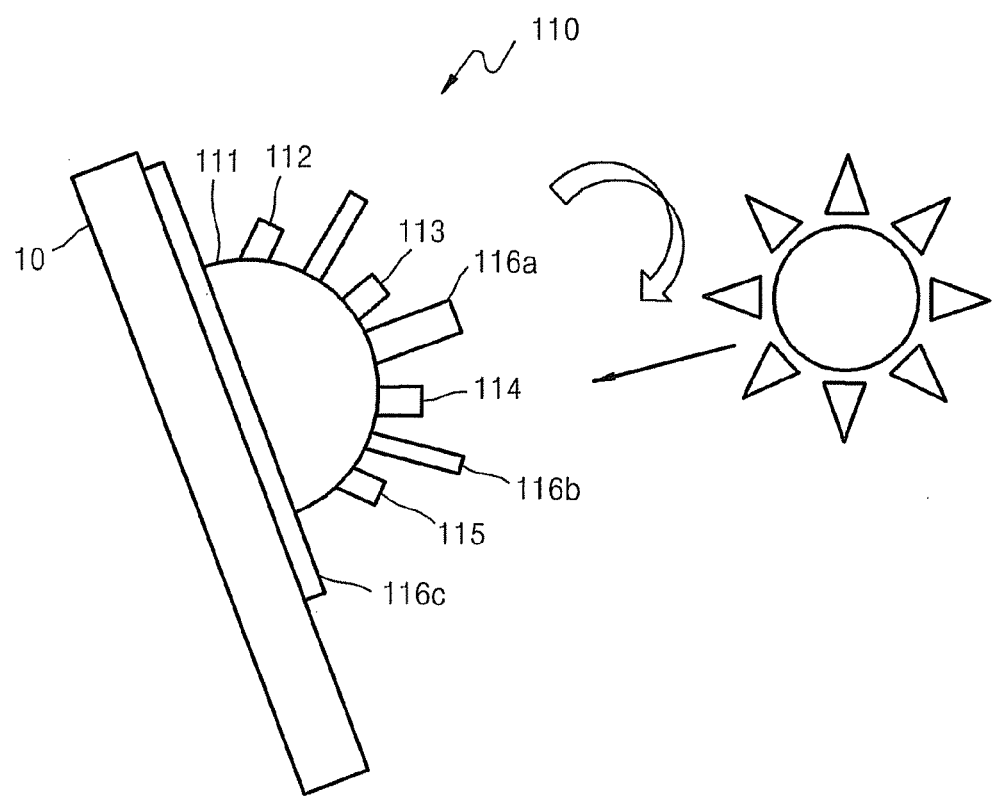
FIG. 5 is a diagram for explaining an operation of the altitude adjustment optical sensor unit of the self-powered solar tracker according to an exemplary embodiment of the present invention.

FIGS. 4 and 5 are diagrams for explaining an operation of the altitude adjustment optical sensor unit of the self-powered solar tracker according to an exemplary embodiment of the present invention.

Referring to FIG. 4, the second upper optical sensor 113 is irradiated with the most intense sunlight, among all optical sensors. Therefore, the passive element circuit 130 compares the output light intensities of the upper optical sensors 112 and 113 with the output light intensities of the lower optical sensors 114 and 115 and outputs a driving signal for controlling the altitude of the solar collector panel 10 in a direction having a greater output light intensity value. Thus, since the output light intensity of the second upper optical sensor 113 is greater than the output light intensities of the first lower optical sensor 114 and the second lower optical sensor 115 when comparing the second upper optical sensor 113 and each of the first lower optical sensor 114 and the second lower optical sensor 115, the passive element circuit 130 outputs a driving signal for the altitude adjustment driving unit 360 to control the solar collector panel 10 to move upwards.

Referring to FIG. 5, the first lower optical sensor 114 and the second optical sensor 115 receive more amount of sunlight than the first upper optical sensor 112 and the second upper optical sensor 113, and each optical sensor 112, 113, 114, and 115 outputs a voltage corresponding to the intensity of sunlight to the passive element circuit 130. Accordingly, the passive element circuit 130 compares the outputs of the optical sensors 112, 113, 114, and 115.

As the output light intensities of the lower optical sensors 114 and 115 are greater than those of the upper optical sensor 112 and 113, the passive element circuit 130 outputs a driving signal for the altitude adjustment driving unit 360 to control the solar collector panel 10 to move downwards. Consequently, the solar collector panel 10 moves from the upper position to the lower position, and thereby the output light intensities of the lower optical sensors 114 and 115 become equal to the output light intensities of the upper optical sensors 112 and 113. The solar collector panel 10 keeps moving until the output light intensities of the lower optical sensors 114 and 115 become the same as the output light intensities of the upper optical sensors 112 and 113, and stops moving when the output light intensities all reach the same value.

Figure 6:
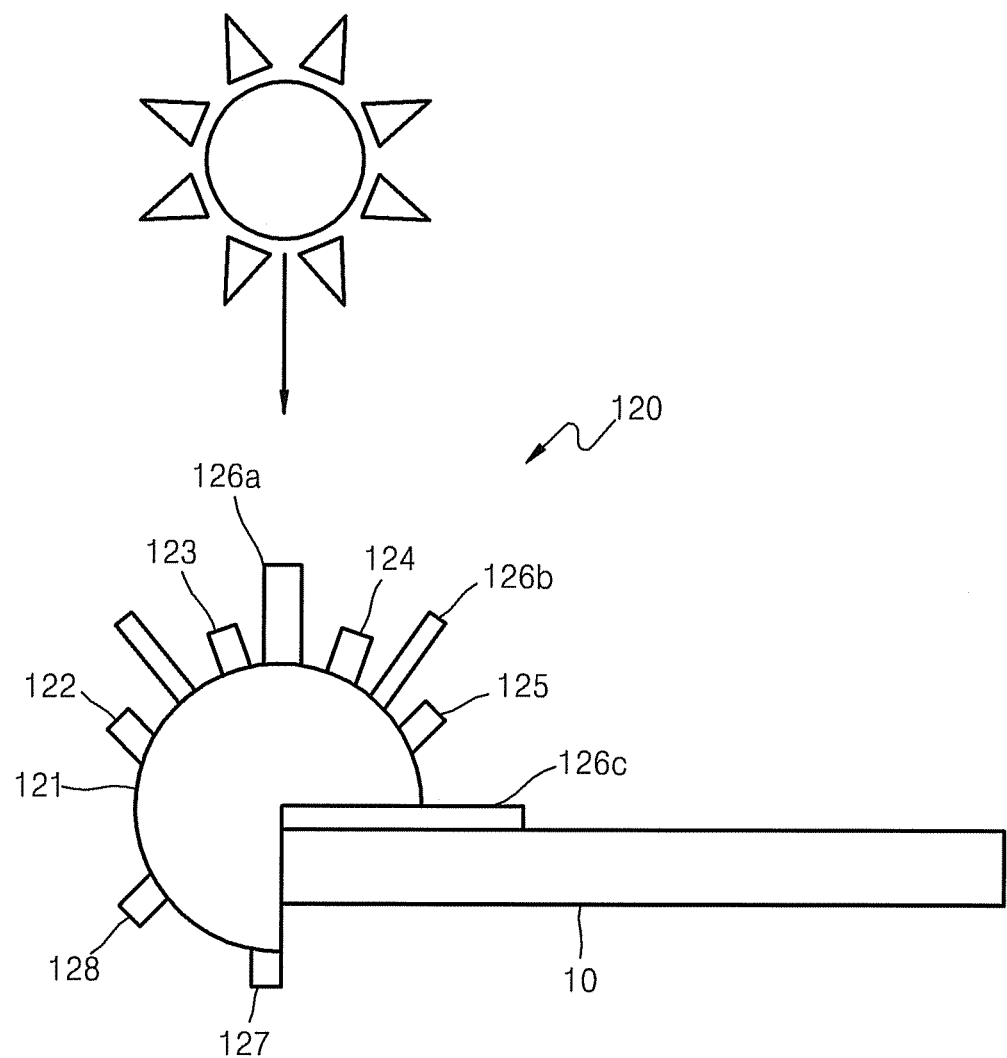
FIG. 6 is a diagram for explaining a horizontal rotation optical sensor unit of the self-powered solar tracker according to an exemplary embodiment of the present invention.

FIG. 6 is a diagram for explaining the horizontal rotation optical sensor unit 120 of the self-powered solar tracker according to an exemplary embodiment of the present invention.

Referring to FIG. 6, the horizontal rotation optical sensor unit 120 may include a support unit 121 with a hemisphere shape, on which a first left optical sensor 122, a second left optical sensor 123, a first right optical sensor 124, a second right optical sensor 125, a first rear optical sensor 127 and a second rear optical sensor 128 are formed. When facing the sun, the first left optical sensor 122 and the second left optical sensor 124 are located at the left side of the horizontal rotation optical sensor unit 120 and the first right optical sensor 124 and the second right optical sensor 125 are located at the right side of the horizontal rotation optical sensor unit 120. The first rear optical sensor 127 and the second rear optical sensor 128 are located close to the first left optical sensor 122 and opposite to a central partition 126a on the support unit 121.

Each of the various optical sensors 122, 123, 124, 125, 126, and 127 may be formed of an electrical component, such as a phototransistor, a photodiode, CDS, or a solar cell, which generates sunlight and generates an electric current. Between every two optical sensors 122, 123, 124, and 125 there is a partition 126a, 126b, and 126c. The partitions 126a, 126b, and 126c are disposed between the optical sensors 122, 123, 124, and 125, extending in radial directions on the hemispheric support unit 121 so as to prevent each optical sensor from being irradiated with light intended to be incident to a neighboring optical sensor. One partition 126a is mounted on a surface that directly faces the sun. The partitions 126a, 126b, and 126c are securely fixed by a case (not shown). The case may serve as the same function as the partitions 126a, 126b, and 126c.

However, aspects of the present invention are not limited thereto, such that although not illustrated, there may be provided a partition between the first left optical sensor 122 and the second rear optical sensor 128, and between the second rear optical sensor 128 and the first rear optical sensor 128.

The horizontal rotation optical sensor unit 120 may be disposed on the solar collector panel 10 to be in parallel to the ground surface. The horizontal rotation optical sensor unit 120 may be disposed at various locations on the solar collector panel 10. For example, the horizontal rotation optical sensor 120 may be located on the lower right portion of the solar collector panel 10. However, aspects of the present invention are not limited thereto, such that the mounting location of the horizontal rotation optical sensor 120 may be various parts of the solar collector panel 10 including the right side, the lower right portion, the left side, the upper left portion, the lower left portion, the upper central portion, the lower upper portion, and the like.

The passive element circuit 130 compares the output light intensities of the first left optical sensor 122, the second left optical sensor 123, the first right optical sensor 124, and the second right optical sensor 125, and outputs a driving signal to perform a horizontal rotation of the solar collector panel in a direction having a greater output light intensity value. The passive element circuit 130 outputs a driving signal for the horizontal rotation driving unit 150 to move the solar collector panel 10 to the left or to the right.

In this case, the passive element circuit 130 compares the output light intensities of the left optical sensors 122 and 123 with each of the light intensities of the right optical sensors 124 and 125. The passive element circuit 130 compares the output light intensities between the first left optical sensor 122 and the first right optical sensor 124, and between the second left optical sensor 123 and the second right optical sensor 125.

The passive element circuit 130 compares the output light intensities between the left optical sensors 122 and 123 and each of the right optical sensors 124 and 125, and outputs a driving signal for adjustment of the horizontal rotation of the solar collector panel 10 in a direction having a greater output light intensity value.

For example, if the output light intensity of the first left optical sensor 122 is greater than that of the first right optical sensor 124 when the passive element circuit 130 compares the output light intensity of the first left optical sensor 122 and the first right optical sensor 124, the passive element circuit 130 outputs a driving signal for the horizontal rotation driving unit 150 to move the solar collector panel 10 to the left (in a counter-clockwise direction).

On the contrary, if the output light intensity of the first left optical sensor 124 is greater than that of the first left optical sensor 122 when the passive element circuit 130 compares the output light intensity of the first left optical sensor 122 and the first right optical sensor 124, the passive element circuit 130 outputs a driving signal for the horizontal rotation driving unit 150 to move the solar collector panel 10 to the right (in a clockwise direction).

Meanwhile, if there is no significant difference in output light intensity between the first left optical sensor 122 and the first right optical sensor 124 as a result of comparing the first left optical sensor 122 and the first right optical sensor 124, the passive element circuit 130 outputs a driving signal for the horizontal rotation driving unit 150 to maintain the solar collector panel 10 at its current position.

The sun rises up from the east and sets down towards the west, and in the summer, the elevation of the sun is higher in summer time (maximum on the summer solstice), and the elevation is lower in winter time (minimum on the winter solstice).

Hence, if the solar collector panel 10 follows the sun's movement by accurately tracking the sun's position and adjusting the altitude and the horizontal rotation of the solar collector panel 10, the generation efficiency of the solar collector panel 10 can be optimized.

FIGS. 7 through 10 are diagrams for explaining the horizontal rotation of the solar collector panel 10 in accordance with the horizontal rotation optical sensor unit 120 in the self-powered solar tracker according to an exemplary embodiment of the present invention.

Figure 7:
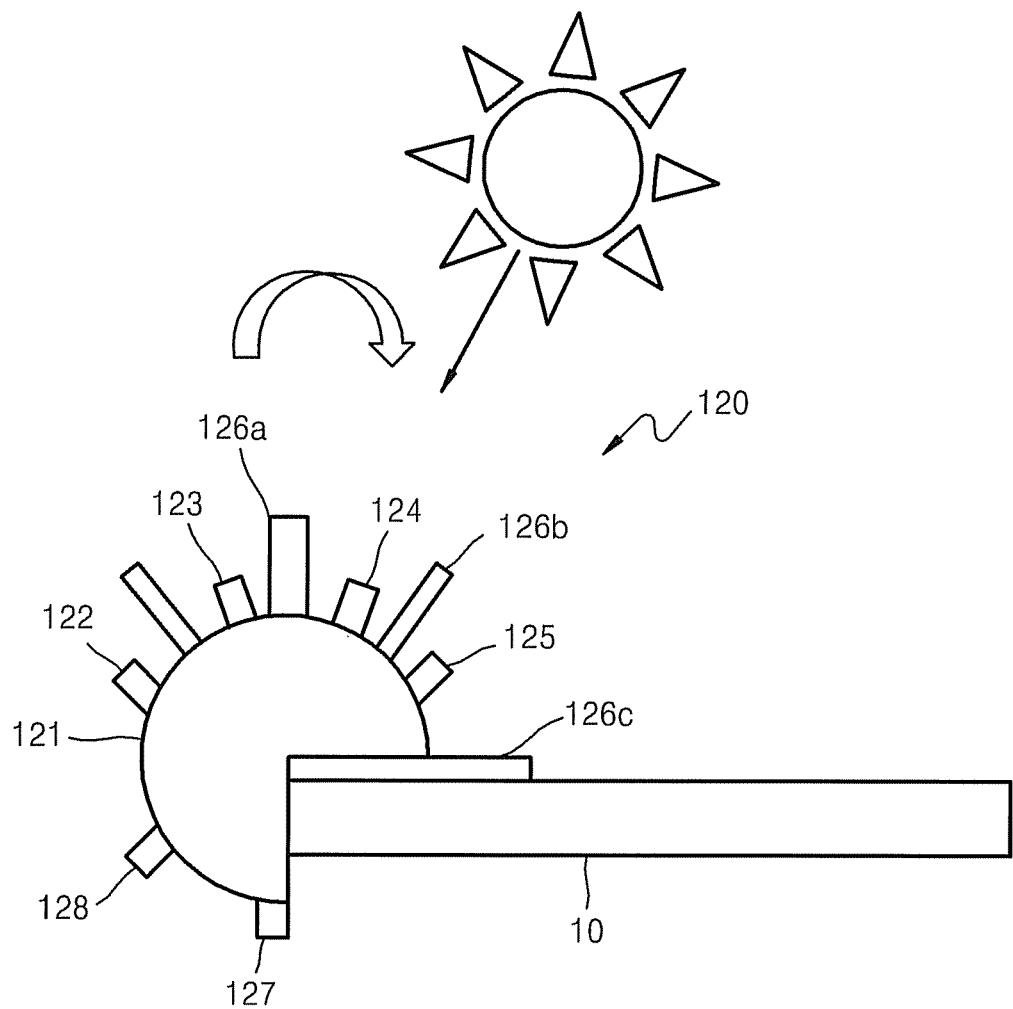
FIG. 7 is a diagram for explaining the operation of the horizontal rotation optical sensor unit of the self-powered solar tracker according to an exemplary embodiment of the present invention.

Referring to FIG. 7, the first right optical sensor 124 and the second right optical sensor 125 receives a large amount of sunlight, while the first left optical sensor 122 and the second left optical sensor 123 receives less amount of sunlight, and each of the optical sensors 122, 123, 124, and 125 outputs a voltage corresponding to the intensity of the received sunlight to the passive element circuit 130. Accordingly, the passive element circuit 130 compares the outputs from the optical sensors 122*m*, 123, 124, and 125.

Since the output light intensities of the right optical sensors 124 and 125 are greater than those of the left optical sensors 122 and 123, the passive element circuit 130 outputs a driving signal for the horizontal rotation driving unit 150 to move the solar collector panel 10 from the left side to the right side. In response to the driving signal, the solar collector panel 10 moves the left to the right (in a clockwise direction), the output light intensities of the right optical sensors 124 and 125 becomes the same as those of the left optical sensors 122 and 123. The solar collector panel 10 keeps moving until the output light intensities of the right optical sensors 124 and 125 become the same as the output light intensities of the left optical sensors 112 and 113, and stops moving when the output light intensities all reach the same value.

Figure 8:
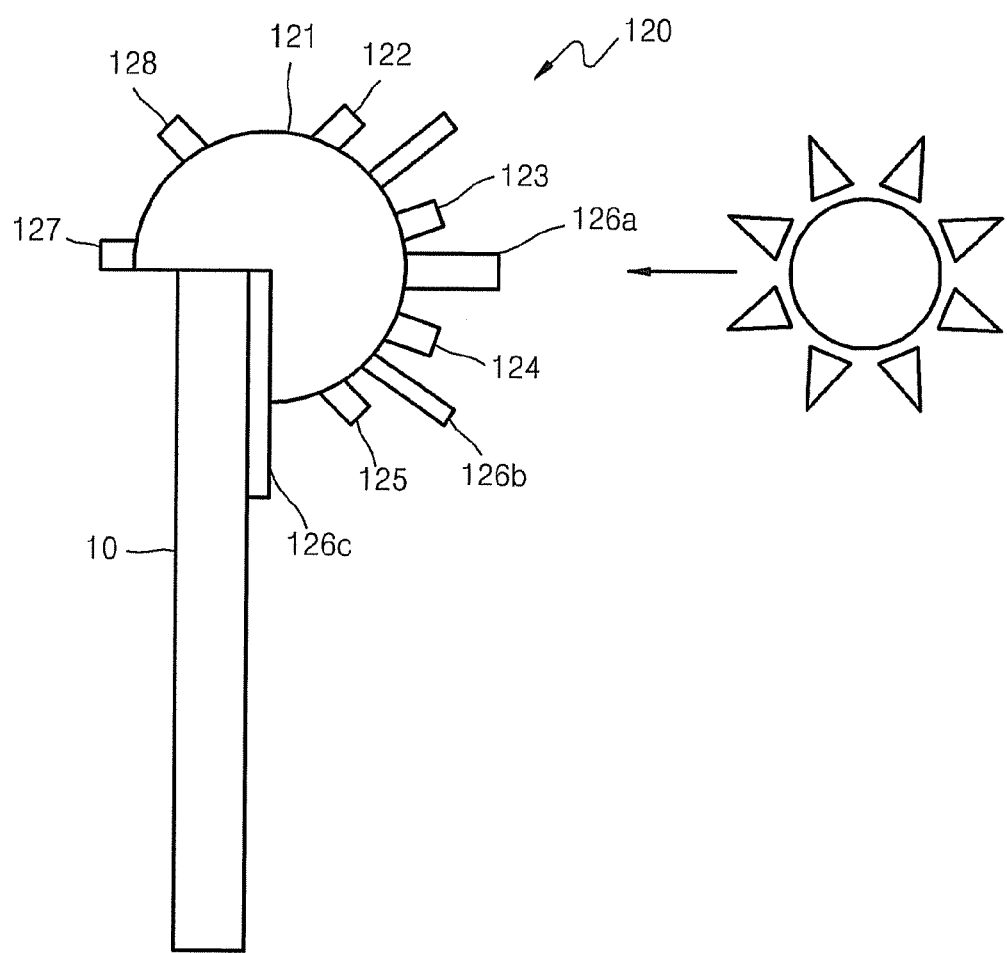
FIG. 8 is a diagram for explaining how the horizontal rotation optical sensor unit of the self-powered solar tracker operates at the time of sunset, according to an exemplary embodiment of the present invention.

FIG. 8 is a diagram for explaining how the horizontal rotation optical sensor unit of the self-powered solar tracker operates at the time of sunset, according to an exemplary embodiment of the present invention.

As the sun sets down, the horizontal rotation optical sensor unit 120 and the solar collector panel 10 are positioned as shown in FIG. 8. After sunset, the solar tracker 100 does not operate, and thus the horizontal rotation optical sensor unit 120 and the solar collector panel 10 stay at the same locations as shown in FIG. 8 until sunrise.

Figure 9:
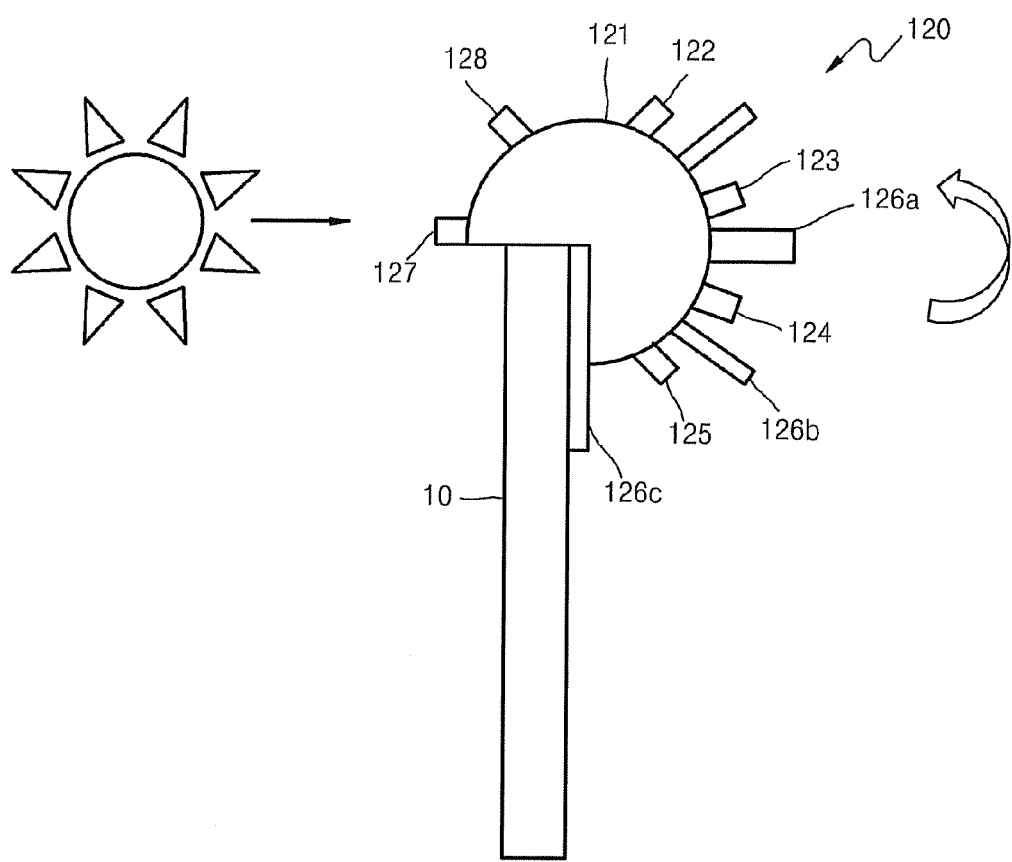
FIG. 9 is a diagram for explaining how the horizontal rotation optical sensor unit of the self-powered solar tracker operates at the time of sunrise, according to an exemplary embodiment of the present invention.

FIG. 9 is a diagram for explaining how the horizontal rotation optical sensor unit of the self-powered solar tracker operates at the time of sunrise, according to an exemplary embodiment of the present invention.

Referring to FIG. 9, until sunrise, the horizontal rotation optical sensor unit 120 and the solar collector panel 10 of the solar tracker 100 are maintained at the same positions as set at the time of sunset of the previous day. Thus, when the sun rises up, the first rear optical sensor 127 faces toward the sun. At this time, the passive element circuit 130 compares the output light intensities of the first and second left optical sensors 122 and 123 with the output light intensities of the first and second right optical sensors 124 and 125, and outputs a driving signal for horizontal rotation of the solar collector panel 10 in a direction having a greater output light intensity value. At sunrise, however, there is no significant difference in the output light intensity between the right optical sensors 124 and 125 and the left optical sensors 122 and 123.

Figure 10:
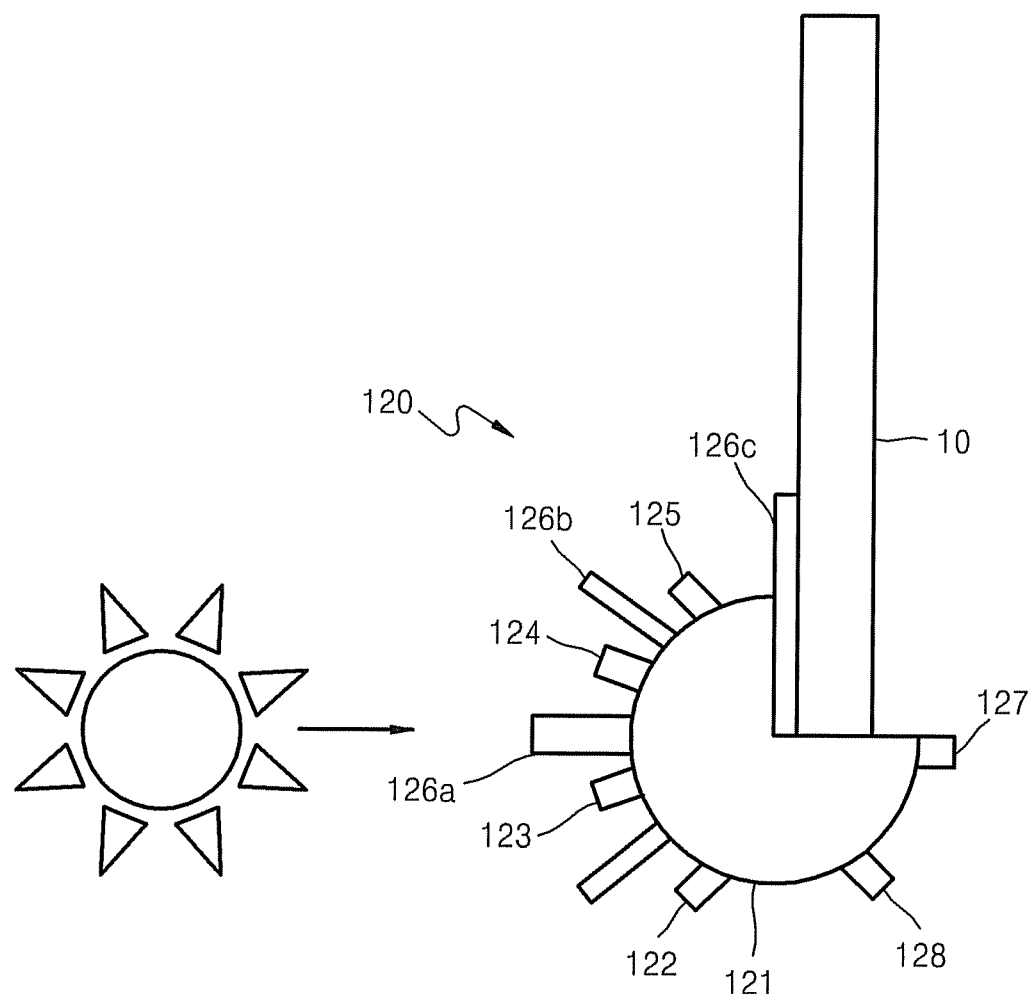
FIG. 10 is a diagram for explaining how the horizontal rotation optical sensor unit of the self-powered solar tracker operates at the time of sunrise, according to an exemplary embodiment of the present invention.

In addition, since the result of comparing the rear sensors 270 and 280 and the right sensor 124 and 125 indicates that the output light intensities of the rear sensors 270 and 280 are greater than the right sensors 124 and 125, the passive element circuit 130 outputs a driving value to horizontally rotate the solar collector panel from the right to the left (in a counter-clockwise direction). Accordingly, the horizontal rotation optical sensor unit 120 and the solar collector panel 10 are positioned, such that the partition 126a disposed on the top of the support unit faces the sun, as shown in FIG. 10.

Figure 11:
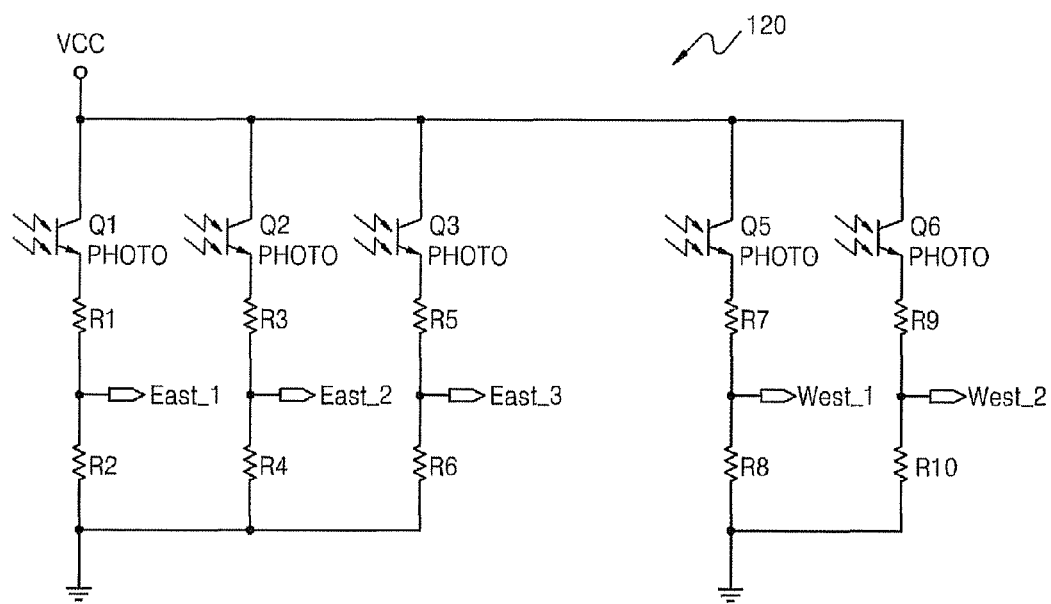
FIG. 11 is a diagram for explaining the horizontal rotation optical sensor unit of the self-powered solar tracker according to an exemplary embodiment of the present invention.

FIG. 11 is a diagram for explaining the horizontal rotation optical sensor unit of the self-powered solar tracker according to an exemplary embodiment of the present invention.

Referring to FIG. 11, the horizontal rotation optical sensor unit 120 may include phototransistors Q1, Q2, Q3, Q4, and Q5. In addition to the phototransistors, the horizontal rotation optical sensor unit 120 may include other electrical components, such as photodiodes, CDS, and solar cells which detect the sunlight and generate an electric current. In FIG. 11, there are provided two left sensors East_1 and East_2, two right sensors West_1 and West_2, and one rear sensor East_3.

Figure 12:
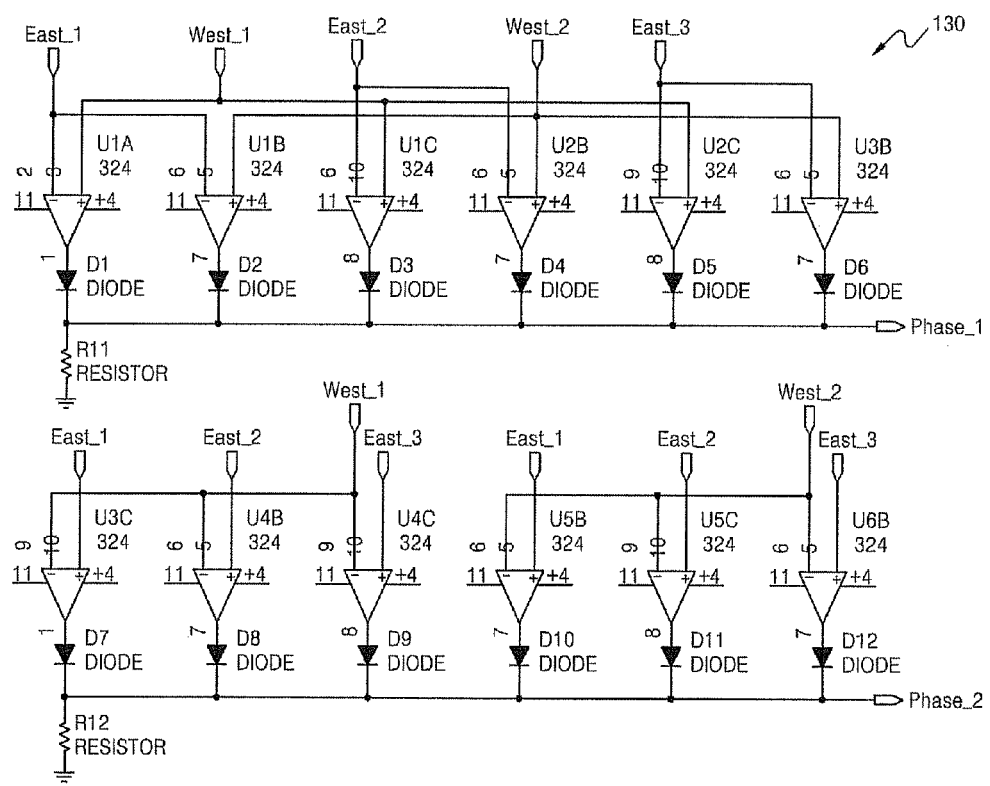
FIG. 12 is a diagram for explaining the passive element circuit of the self-powered solar tracker according to an exemplary embodiment of the present invention.

FIG. 12 is a diagram for explaining the passive element circuit of the self-powered solar tracker according to an exemplary embodiment of the present invention.

Referring to FIG. 12, the passive element circuit 130 includes comparison circuits (OP AMPs) that compare, in association with FIG. 11, the output light intensities of the two left sensors East_1 and East_2 and the one rear sensor East_3 with the output light intensities of the two right sensors West_1 and West_2. A voltage for operation of the comparison circuits may be supplied by the solar cell of the solar collector panel 10. In FIG. 12, "phase 1" and "phase 2" indicate inputs of a motor driver (not shown) to horizontally rotate the solar collector panel 10, and denote a forward driving signal and a reverse driving signal, respectively.

Thus, when the output light intensity of either of the left sensors East_1 and East_2 and the rear sensor East_3 is greater than the output light intensity of the right sensors West_1 and West_2, phase 1 is output as high. When phase 1 is output as high, a motor (not shown) is driven in a forward direction in response to a forward driving signal of the motor driver, so that the solar collector panel 10 is horizontally rotated from the right to the left (in a counter-clockwise direction).

When the output light intensity of either of the right sensors West_1 and West_2 is greater than the output light intensity of the left sensors East_1 and East 2 and the rear sensor East_3, phase 2 is output as high. When phase 2 is output as high, the motor (not shown) is driven in a reverse direction in response to a reverse driving signal of the motor driver, so that the solar collector panel 10 is horizontally rotated from the left to the right (in a clockwise direction).

Figure 13:
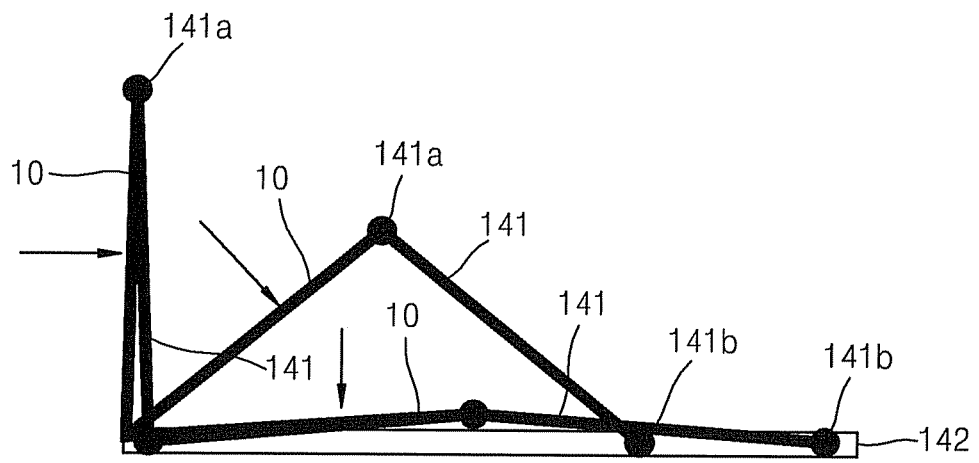
FIG. 13 is a diagram for explaining the altitude adjustment driving unit of the self-powered solar tracker according to an exemplary embodiment of the present invention.

FIG. 13 is a diagram for explaining the altitude adjustment driving unit of the self-powered solar tracker according to an exemplary embodiment of the present invention.

The altitude adjustment driving unit 140 may be configured in various ways to adjust the altitude of the solar collector panel 10 by rotating the solar collector panel up and down in response to a driving signal from the passive element circuit 130. Referring to FIG. 13, the altitude adjustment driving unit 140 includes a support 141 and a linear actuator 142, and the linear actuator 142 may be driven by a driving motor (not shown). The support 141 and the solar collector panel 10 are rotatably coupled with each other via a first coupling shaft 141a, and the support 141 and the linear actuator 142 are coupled with each other via a second coupling shaft 141b.

Hence, as the linear actuator 142 linearly moves left and right, the altitude of the solar collector panel 10 is adjusted through the support 141 coupled to the second coupling shaft 141b. The altitude of the solar collector panel 10 adjustable by the altitude adjustment driving unit 150 may range from 0 degrees to 90 degrees at maximum.

Figure 14:
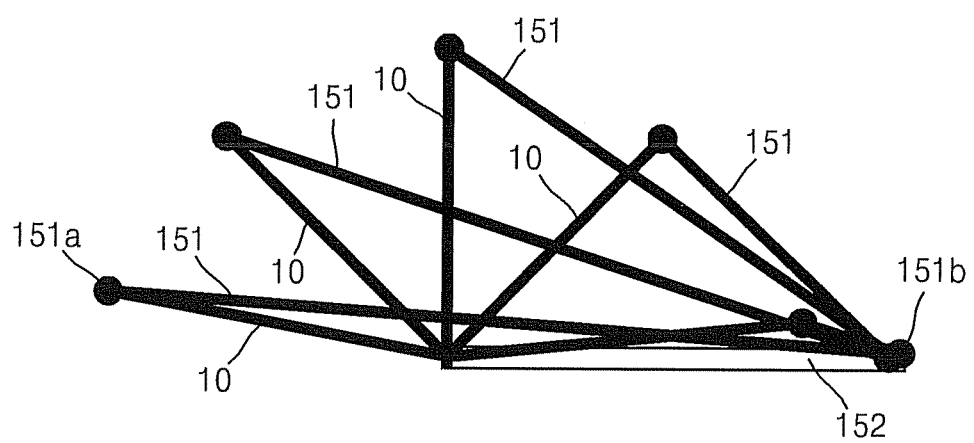
FIG. 14 is a diagram for explaining the horizontal rotation driving unit of the self-powered solar tracker according to an exemplary embodiment of the present invention.

FIG. 14 is a diagram for explaining the horizontal rotation driving unit of the self-powered solar tracker according to an exemplary embodiment of the present invention.

The horizontal rotation driving unit 150 may be configured in various ways to adjust the rotation direction of the solar collector panel 10 by rotating the solar collector panel 10 in a clockwise direction or in a counter-clockwise direction in response to a driving signal from the passive element circuit 130. Referring to FIG. 14, the horizontal rotation driving unit 150 includes a support 111 and a linear actuator 152, and the linear actuator 152 may be driven by a driving motor (not shown). The support 151 and the solar collector panel 10 are rotatably coupled with each other via a first coupling shaft 151a, and the support 151 and the linear actuator 151 are rotatably coupled with each other via a second coupling shaft 151b.

Thus, as the linear actuator 151 moves linearly left and right, the horizontal rotation of the solar collector panel 10 is adjusted through the support 151 coupled to the second coupling shaft 151b. The altitude of the solar collector panel 10 adjustable by the horizontal rotation driving unit 150 may range from 0 degrees to 180 degrees at maximum. As the horizontal rotational angles of the solar collector panel 10 are limited between 0 degrees and 180 degrees by the linear movement of the linear actuator 152 and the movement of the support 151 coupled with the linear actuator 152 via the second coupling shaft 151b, it is possible to prevent the occurrence of damage to the solar tracker 100.

It will be apparent to those skilled in the art that various modifications and variation can be made in the present invention without departing from the spirit or scope of the invention. Thus, it is intended that the present invention cover the modifications and variations of this invention provided they come within the scope of the appended claims and their equivalents.

INDUSTRIAL APPLICABILITY

The present invention can be efficiently applied to the manufacturing of solar trackers.

The invention claimed is:

1. A self-powered solar tracker comprising:
an altitude adjustment optical sensor unit comprising one or more first optical sensors formed on an upper side of a first convex support surface to face the sun and one or more second optical sensors formed on a lower side of the first convex support surface, the altitude adjustment optical sensor unit being configured to sense sunlight so as to adjust an altitude of a solar collector panel;
a horizontal rotation optical sensor unit comprising one or more third optical sensors formed on a left side of a second convex support surface to face the sun and one or more fourth optical sensors formed on a right side of the second convex support surface, the horizontal rotation optical sensor unit being configured to sense sunlight so as to horizontally rotate the solar collector panel;
a passive element circuit comprising one or more first comparison circuits for comparing a difference in output light intensity between the first optical sensors and the second optical sensors and one or more second comparison circuits for comparing a difference in output light intensity between the third optical sensors and the fourth optical sensors, and to output a driving value for adjusting the altitude of and horizontally rotating the solar collector panel in a direction having a larger light intensity value;

an altitude adjustment driving unit configured to receive a driving power source from solar cells of the solar collector panel and to adjust the altitude of the solar collector panel in response to the driving value of the passive element circuit; and a horizontal rotation driving unit configured to perform the horizontal rotation, wherein the horizontal rotation optical sensor unit further comprises one or more fifth optical sensors being disposed on the second convex support surface, the horizontal rotation optical sensor unit being configured to be adjusted such that one or more fifth optical sensors are positioned on a side of the second convex support surface that is opposite to a light incident side.

2. The self-powered solar tracker of claim 1, wherein:

the one or more first comparison circuits compare the output light intensities of the first optical sensors with the output light intensities of the second optical sensors, and output a driving value to adjust the altitude of the solar collector panel in a direction having a larger light intensity value, and the one or more second comparison circuits compare the output light intensities of the third optical sensors with the output light intensities of the fourth optical sensors, and output a driving value to horizontally rotate the solar collector panel in a direction having a larger light intensity value.

3. The self-powered solar tracker of claim 2, wherein:

the one or more first comparison circuits compare the output light intensities between the first optical sensors and the second optical sensors, and output a driving value for altitude adjustment to move the solar collector panel upward if light intensity values of the first optical sensors are greater than those of the second optical sensors, or to move the solar collector panel downward if the light intensities values of the second optical sensors are greater, and the one or more second comparison circuits compare the output light intensities between the third optical sensors and the fourth optical sensors, and output a driving value to horizontally rotate the solar collector panel in a left direction if any of light intensity values of the third optical sensors are greater than those of the fourth optical sensors, or to horizontally rotate the solar collector panel in a right direction if any of light intensity values of the fourth optical sensors are greater than the third optical sensors.

4. The self-powered solar tracker of claim 1, wherein the one or more second comparison circuits compare output light intensities between the fifth optical sensors and the fourth optical sensors, and output a driving value to horizontally rotate the solar collector panel in a left direction if any of intensity light values of the fifth optical sensors are greater than those of the fourth optical sensors.

5. The self-powered solar tracker of claim 1, wherein each of the altitude adjustment optical sensor unit and the horizontal rotation optical sensor unit further comprises one or more partitions extending radially from the first and second convex support surfaces, respectively, so as to prevent each optical sensor from being irradiated with light intended to be incident to a neighboring optical sensor.

6. The self-powered solar tracker of claim 5, wherein one of the partitions is mounted on a portion of the first and second convex support surfaces that directly faces the sun.

7. The self-powered solar tracker of claim 1, wherein each of the optical sensors, which are included in the altitude adjustment optical sensor unit and the horizontal rotation optical sensor unit, has at least a part of a lower end to be inserted in the first and second convex support surfaces.

8. The self-powered solar tracker of claim 1, wherein each of the altitude adjustment optical sensor unit and the horizontal rotation optical sensor unit further comprises a case configured to prevent light entering from both sides of each optical sensor.

9. The self-powered solar tracker of claim 1, wherein the altitude adjustment driving unit and the horizontal rotation driving unit are driven when the solar collector panel is irradiated with more than a predetermined intensity of sunlight.

10. The self-powered solar tracker of claim 1, wherein the altitude adjustment driving unit performs altitude adjustment of the solar collector panel in a direction having a larger light intensity value according to an output from the first comparison circuits.

11. The self-powered solar tracker of claim 1, wherein the horizontal rotation driving unit performs horizontal rotation of the solar collector panel in a direction having a larger light intensity value according to an output from the second comparison circuits.

12. The self-powered solar tracker of claim 1, wherein the altitude adjustment optical sensor unit and the horizontal rotation optical sensor unit are integrally formed on the solar collector panel.

* * * * *